(12) United States Patent
Mikogami et al.

(10) Patent No.: US 10,347,416 B2
(45) Date of Patent: Jul. 9, 2019

(54) COIL COMPONENT, CIRCUIT BOARD PROVIDED WITH THE SAME, AND MANUFACTURING METHOD FOR COIL COMPONENT

(71) Applicant: TDK CORPORATION, Tokyo (JP)

(72) Inventors: Tasuku Mikogami, Tokyo (JP); Nobuo Takagi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 35 days.

(21) Appl. No.: 16/007,152

(22) Filed: Jun. 13, 2018

(65) Prior Publication Data

US 2018/0366259 A1 Dec. 20, 2018

(51) Int. Cl.
*H01F 27/29* (2006.01)
*H05K 1/18* (2006.01)
*H01F 27/24* (2006.01)
*H01F 41/06* (2016.01)
*H01F 41/10* (2006.01)
*H01F 27/28* (2006.01)

(52) U.S. Cl.
CPC ........... *H01F 27/292* (2013.01); *H01F 27/24* (2013.01); *H01F 27/2823* (2013.01); *H01F 41/06* (2013.01); *H01F 41/10* (2013.01); *H05K 1/181* (2013.01); *H05K 2201/094* (2013.01); *H05K 2201/1003* (2013.01)

(58) Field of Classification Search
CPC .......... H01F 27/92; H01F 41/06; H01F 41/10; H01F 27/2823; H01F 27/24; H05K 1/181; H05K 2201/1003; H05K 2201/094

USPC .......................................... 174/260; 336/192
See application file for complete search history.

(56) References Cited

U.S. PATENT DOCUMENTS

| | | | | |
|---|---|---|---|---|
| 2008/0309445 | A1* | 12/2008 | Suzuki | H01F 27/2823 336/183 |
| 2010/0109827 | A1 | 5/2010 | Asou et al. | |
| 2014/0292465 | A1* | 10/2014 | Takagi | H01F 27/292 336/192 |
| 2015/0084731 | A1* | 3/2015 | Takagi | H01F 19/08 336/212 |
| 2015/0287520 | A1 | 10/2015 | Takagi et al. | |
| 2016/0133377 | A1* | 5/2016 | Takagi | H01F 27/2823 336/192 |

(Continued)

FOREIGN PATENT DOCUMENTS

| JP | 2010109267 A | 5/2010 |
|---|---|---|
| JP | 2015201613 A | 11/2015 |
| JP | 2017041589 A | 2/2017 |

*Primary Examiner* — Sherman Ng
(74) *Attorney, Agent, or Firm* — Young Law Firm, P.C.

(57) ABSTRACT

Disclosed herein is a coil component that includes: a drum core including a winding core part, a first flange part provided at one end of the winding core part in an axial direction of the winding core part, and a second flange part provided at other end of the winding core part in the axial direction of the winding core part; first, second, third, and fourth terminal electrodes provided on the first flange part; fifth, sixth, and seventh terminal electrodes provided on the second flange part; and first, second, third, and fourth wires wound around the winding core part, wherein one ends of the first to fourth wires are each connected to any one of the first to fourth terminal electrodes, and wherein other ends of the first to fourth wires are each connected to any one of the fifth to seventh terminal electrodes.

14 Claims, 13 Drawing Sheets

(56) References Cited

U.S. PATENT DOCUMENTS

2016/0155561 A1\* 6/2016 Takagi ................ H01F 27/2823
                                                           336/222
2017/0053726 A1   2/2017 Takagi
2017/0229227 A1\* 8/2017 Igarashi .................... H01F 3/10
2018/0053594 A1\* 2/2018 Hsieh .................. H01F 27/2823

\* cited by examiner

COIL COMPONENT, CIRCUIT BOARD PROVIDED WITH THE SAME, AND MANUFACTURING METHOD FOR COIL COMPONENT

BACKGROUND OF THE INVENTION

Field of the Invention

The present invention relates to a coil component and a circuit board provided with the same and, more particularly, to a coil component using a drum core and a circuit board provided with the same. The present invention also relates to a manufacturing method for the coil component using a drum core.

Description of Related Art

As a surface-mount type coil component using a drum core, there are known coil components described in JP 2010-109267 A and JP 2015-201613 A. In both JP 2010-109267 A and JP 2015-201613 A, the coil component has one and the other ends thereof each having three terminal electrodes and four wires. One ends of four wires are each connected to any one of the three terminal electrodes provided in the one end, and the other ends of the four wires are each connected to any one of the three terminal electrodes provided in the other end.

In the coil components described in JP 2010-109267 A and JP 2015-201613 A, one of the three terminal electrodes provided in each flange part serves as a center tap, to which two wires are connected in common.

When two wires are connected in common to one terminal electrode, wire connection strength may become insufficient or wire connection position may be displaced. To solve such problems, two wires are connected to different terminal electrodes, and the terminal electrodes are short-circuited on a circuit board; in this case, however, the terminal electrodes increased in number leads to a decrease in distance between adjacent terminal electrodes, which may lower a withstand voltage.

SUMMARY

It is therefore an object of the present invention to provide a coil component capable of enhancing wire connection strength while minimizing lowering of withstand voltage and hardly causing displacement in wire connection position, a circuit board provided with the coil component, and a manufacturing method for the coil component.

A coil component according to the present invention includes: a drum core including a winding core part, a first flange part provided at one end of the winding core part in the axial direction thereof, and a second flange part provided at the other end of the winding core part in the axial direction thereof; first, second, third, and fourth terminal electrodes provided on the first flange part; fifth, sixth, and seventh terminal electrodes provided on the second flange part; and first, second, third, and fourth wires wound around the winding core part. One ends of the first to fourth wires are each connected to any one of the first to fourth terminal electrodes, and the other ends of the first to fourth wires are each connected to any one of the fifth to seventh terminal electrodes.

According to the present invention, the four terminal electrodes are provided on the first flange part, so that connection strength between each of the terminal electrodes provided on the first flange part and each wire can be enhanced, and the connection position therebetween can be prevented from being displaced. On the other hand, the number of the terminal electrodes provided on the second flange part is three, so that lowering of a withstand voltage at the second flange part can be prevented.

In the present invention, the first to fourth terminal electrodes may be arranged in this order in a direction perpendicular to the axial direction, the fifth to seventh terminal electrodes may be arranged in this order in a direction perpendicular to the axial direction, the one end of the first wire may be connected to one of the first and second terminal electrodes, the one end of the second wire may be connected to the other one of the first and second terminal electrodes, and the other ends of the respective first and second wires may each be connected to the fifth terminal electrode. With this configuration, the distance between the fifth and sixth terminal electrodes can be sufficiently ensured.

In the present invention, the one end of the third wire may be connected to one of the third and fourth terminal electrodes, the one end of the fourth wire may be connected to the other one of the third and fourth terminal electrodes, the other end of the third wire may be connected to one of the sixth and seventh terminal electrodes, the other end of the fourth wire may be connected to the other one of the sixth and seventh terminal electrodes, and the first and third wires and second and fourth wires may be wound in opposite directions. With this configuration, a pulse transformer can be constituted.

In the present invention, a winding block constituted of the first to fourth wires wound around the winding core part may include a lower layer constituted of the first and third wires and an upper layer constituted of the second and fourth wires wound over the lower layer. With this configuration, the four wires are wound in two layers, so that the length of the winding core part can be shortened.

In the present invention, the first and second flange parts may each have an inside surface connected to the winding core part, and a space formed between the inside surface of the first flange part and the winding block may be narrower than a space formed between the inside surface of the second flange part and the winding block. With this configuration, when the first and second flange parts are set as the winding start side and winding end side, respectively, a sufficient margin can be ensured at the winding end side. In addition, since the four terminal electrodes are provided on the first flange part, wire connection strength can be enhanced at the winding start side to which a strong tensile stress is applied.

In the present invention, the first and second flange parts may each have an outside surface positioned on the side opposite to the inside surface thereof, and the connection positions of one ends of the first and third wires may be closer to the outside surface of the first flange part than the connection positions of one ends of the second and fourth wires are. With this configuration, stress caused due to contact between the winding start portions of the first and third wires and the winding core part can be relieved.

In the present invention, the connection positions of the other ends of the first and third wires may be closer to the outside surface of the second flange part than the connection positions of the other ends of the second and fourth wires are. With this configuration, stress caused due to contact between the winding end portions of the first and third wires and the winding core part can be relieved.

A circuit board according to an aspect of the present invention includes the above-described coil component and a substrate mounting the coil component thereon, wherein the substrate has first to seventh land patterns connected respectively to the first to seventh terminal electrodes. According to the present invention, there can be provided a circuit board having a substrate matching the above coil component.

A circuit board according to another aspect of the present invention includes the above-described coil component and a substrate mounting the coil component thereon, wherein the substrate has first to sixth land patterns, the first land pattern being connected to the first terminal electrode, the second land pattern being connected to the second terminal electrode, the third land pattern being connected to the third and fourth terminal electrodes, the fourth land pattern being connected to the fifth terminal electrode, the fifth land pattern being connected to the sixth terminal electrode, the sixth land pattern being connected to the seventh terminal electrode. According to the present invention, the coil component of the present invention having a seven-terminal configuration can be treated as a six-terminal configuration.

In the present invention, the planar size of the third land pattern may be larger than the planar size of each of the first, second, fifth, and sixth land patterns. With this configuration, the third and fourth terminal electrodes can be short-circuited reliably on the circuit board.

In the present invention, the third and fourth land patterns may have the same planar size. With this configuration, directionality of the coil component of the preset invention having the seven-terminal configuration can be eliminated.

A coil component manufacturing method according to the present invention includes: preparing a drum core including a winding core part, a first flange part provided at one end of the winding core part in the axial direction thereof, and a second flange part provided at the other end of the winding core part in the axial direction thereof; forming first, second, third, and fourth terminal electrodes arranged in this order in a direction perpendicular to the axial direction on the first flange part and forming fifth, sixth, and seventh terminal electrodes arranged in this order in a direction perpendicular to the axial direction on the second flange part; winding the first and third wires around the winding core part of the drum core in a state where one end of the first wire is connected to one of the first and second terminal electrodes and where one end of the third wire is connected to one of the third and fourth terminal electrodes and connecting the other ends of the first and third wires respectively to the fifth terminal electrode and one of the sixth and seventh terminal electrodes; and winding the second and fourth wires around the winding core part of the drum core in a state where one end of the second wire is connected to the other one of the first and second terminal electrodes and where one end of the fourth wire is connected to the other one of the third and fourth terminal electrodes and connecting the other ends of the second and fourth wires respectively to the fifth terminal electrode and the other one of the sixth and seventh terminal electrodes. According to the present invention, a coil component having a seven-terminal configuration can be manufactured.

In the present invention, the first and second flange parts each have an inside surface connected to the winding core part and an outside surface positioned on the side opposite to the inside surface, and the connection positions of one ends of the first and third wires may be closer to the outside surface of the first flange part than the connection positions of one ends of the second and fourth wires are. With this configuration, stress caused due to contact between the winding start portions of the first and third wires and the winding core part can be relieved.

In the present invention, the connection positions of the other ends of the first and third wires may be closer to the outside surface of the second flange part than the connection positions of the other ends of the second and fourth wires are. With this configuration, stress caused due to contact between the winding end portions of the first and third wires and the winding core part can be relieved.

Thus, according to the present invention, there can be provided a coil component capable of enhancing wire connection strength while minimizing lowering of withstand voltage and hardly causing displacement in wire connection position, a circuit board provided with the coil component, and a manufacturing method for the coil component.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

First Embodiment

Figure 1:
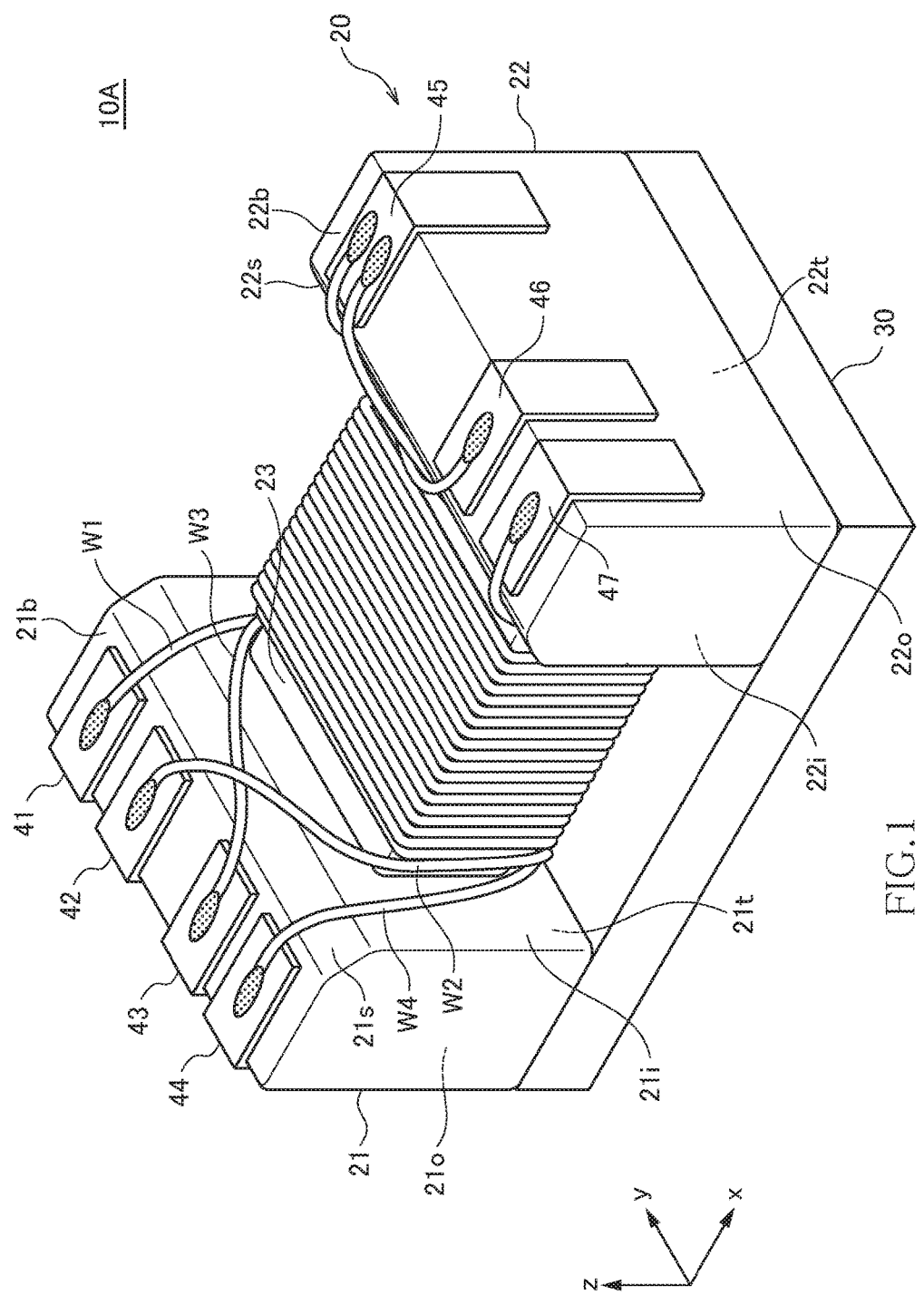
FIG. 1 is a schematic perspective view illustrating the outer appearance of a coil component according to a first embodiment of the present invention.

FIG. 1 is a schematic perspective view illustrating the outer appearance of a coil component 10A according to the first embodiment of the present invention.

The coil component 10A according to the present embodiment is a pulse transformer and has a drum core 20, a plate-like core 30, seven terminal electrodes 41 to 47, and four wires W1 to W4, as illustrated in FIG. 1.

The drum core 20 includes a winding core part 23, a first flange part 21 provided at one end of the winding core part 23 in the axial direction (x-direction), and a second flange part 22 provided at the other end of the winding core part 23 in the axial direction. The drum core 20 is a block made of a high permeability material such as ferrite and has a configuration in which the flange parts 21 and 22 and winding core part 23 are formed integrally. While the yz cross section (cross section perpendicular to the axial direction) of the winding core part 23 has a rectangular shape, the corners thereof are chamfered by barrel polishing. The cross section of the winding core part 23 need not necessarily be rectangular but may have other shapes, e.g., a polygonal shape other than a rectangle, such as a hexagon or an octagon. Further, the winding core part 23 may partially have a curved surface.

The first flange part 21 has an inside surface 21$i$ connected to the winding core part 23, an outside surface 21$o$ positioned on the side opposite to the inside surface 21$i$, a bottom surface 21$b$ facing a substrate at mounting, and a top surface 21$t$ positioned on the side opposite to the bottom surface 21$b$. The inside surface 21$i$ and the outside surface 21$o$ each constitute the yz plane, and the bottom surface 21$b$ and top surface 21$t$ each constitute the xy plane. Similarly, the second flange part 22 has an inside surface 22$i$ connected to the winding core part 23, an outside surface 22$o$ positioned on the opposite side to the inside surface 22$i$, a bottom surface 22$b$ facing the substrate at mounting, and a top surface 22$t$ positioned on the side opposite to the bottom surface 22$b$. The inside surface 22$i$ and the outside surface 22$o$ each constitute the yz plane, and the bottom surface 22$b$ and the top surface 22$t$ each constitute the xy plane. In the present embodiment, the corner between the bottom surface 21$b$ and the inside surface 21$i$ of the first flange part 21 is chamfered to have a slope 21$s$. Similarly, the corner between the bottom surface 22$b$ and the inside surface 22$i$ of the second flange part 22 is chamfered to have a slope 22$s$.

The plate-like core 30 is bonded to the top surface 21$t$ of the first flange part 21 and the top surface 22$t$ of the second flange part 22. The plate-like core 30 is a plate-like member made of a high permeability material such as ferrite and constitutes a closed magnetic path together with the drum core 20. The plate-like core 30 may be made of the same material as that of the drum core 20.

As illustrated in FIG. 1, the four terminal electrodes 41 to 44 are provided on the first flange part 21. The terminal electrodes 41 to 44 are arranged in this order in the y-direction and each have an L-like shape that covers the bottom surface 21$b$ and the outside surface 21$o$. The first terminal electrode 41 is connected with one end of the first wire W1, the second terminal electrode 42 is connected with one end of the second wire W2, the third terminal electrode 43 is connected with one end of the third wire W3, and the fourth terminal electrode 44 is connected with one end of the fourth wire W4.

On the other hand, the three terminal electrodes 45 to 47 are provided on the second flange part 22. The terminal electrodes 45 to 47 are arranged in this order in the y-direction and each have an L-like shape that covers the bottom surface 22$b$ and the outside surface 22$o$. The fifth terminal electrode 45 is connected with the other ends of the first and second wires W1 and W2 in common, the sixth terminal electrode 46 is connected with the other end of the fourth wire W4, and the seventh terminal electrode 47 is connected with the other end of the third wire W3.

The terminal electrodes 41 to 47 may each be a terminal metal fitting bonded to the drum core 20 or may each be directly formed on the drum core 20 using a conductive paste.

Figure 2:
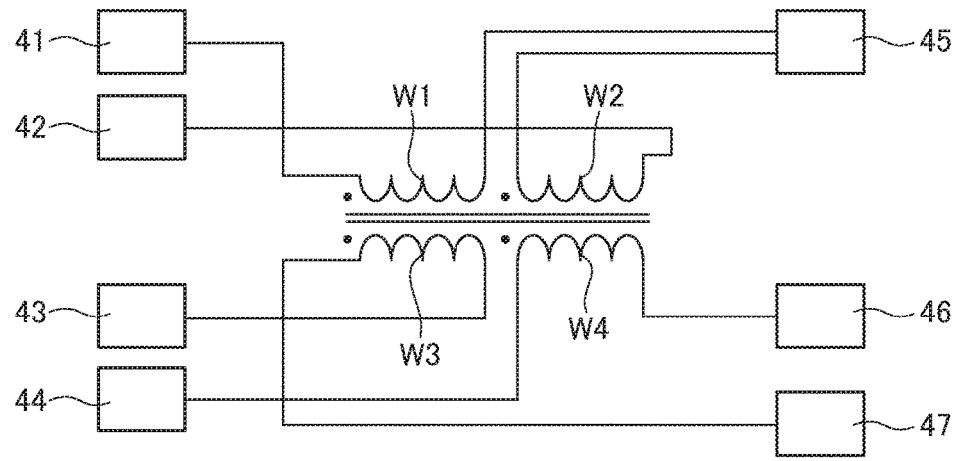
FIG. 2 is an equivalent circuit diagram of the coil component shown in FIG. 1.

The first and third wires W1 and W3 and the second and fourth wires W2 and W4 are wound in opposite directions. Thus, as illustrated in the circuit diagram of FIG. 2, a pulse transformer is constituted, in which the first and second terminal electrodes 41 and 42 function as a pair of primary-side terminals, the sixth and seventh terminal electrodes 46 and 47 function as a pair of secondary-side terminals, the fifth terminal electrode 45 functions as a primary-side center tap, and the third and fourth terminal electrodes 43 and 44 each function as a secondary-side center tap. Here, the primary side and the secondary side are defined conveniently, and they may be reversed.

The first and second terminal electrodes 41 and 42 constituting the pair of primary-side terminals are terminals that receive or output a pair of differential signals. The connection relationship between the first and second terminal electrodes 41 and 42 and the first and second wires W1 and W2 is not limited to that illustrated in FIGS. 1 and 2 and may be reversed. Similarly, the sixth and seventh terminal electrodes 46 and 47 constituting the pair of secondary-side terminals are terminals to receive or output a pair of differential signals. The connection relationship between the sixth and seventh terminal electrodes 46 and 47 and the third and fourth wires W3 and W4 is not limited to that illustrated in FIGS. 1 and 2 and may be reversed. Further, the third and fourth terminal electrodes 43 and 44 are each a terminal electrode constituting the secondary-side center tap and applied with the same potential, so that the connection relationship between the third and fourth terminal electrodes 43 and 44 and the third and fourth wires w3 and W4 may be reversed.

FIGS. 3 to 6 are schematic plan views for explaining a manufacturing method for the coil component 10A according to the present embodiment.

Figure 3:
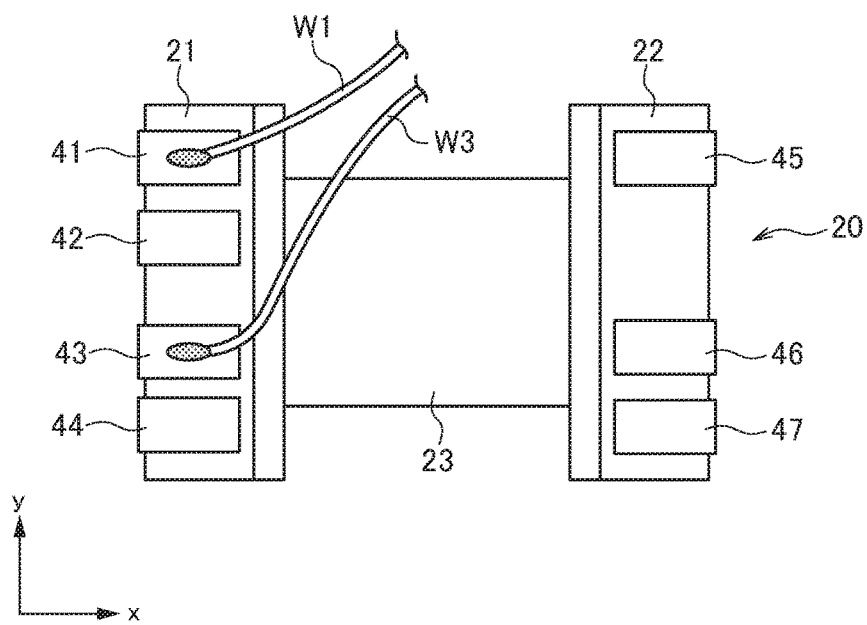
FIGS. 3 to 6 are schematic plan views for explaining a manufacturing method for the coil component according to the first embodiment of the present invention.

First, the drum core 20 is prepared, and the terminal electrodes 41 to 44 and the terminal electrodes 45 to 47 are formed on the first flange part 21 and the second flange part 22, respectively. Then, as illustrated in FIG. 3, one end of the first wire W1 is connected to the first terminal electrode 41, and one end of the third wire W3 is connected to the third terminal electrode 43. Specifically, the first and third wires w1 and W3 are disposed on the first and third terminal electrodes 41 and 43, respectively, and then a heating head is pressed against the first and third wires W1 and W3, whereby the first and third wires W1 and W3 are thermally press-fitted to the first and third terminal electrodes 41 and 43, respectively. In this state, the drum core 20 is rotated in one direction to wind the first and third wires W1 and W3 around the winding core part 23 of the drum core 20. Upon starting the winding, the drum core 20 needs to be rotated in a state where the first and third wires W1 and W3 are pulled so as to prevent the first and third wires W1 and W3 from being loosened. Thus, somewhat strong tensile stress is applied to the joining parts of the respective first and third wires W1 and W3.

Figure 4:
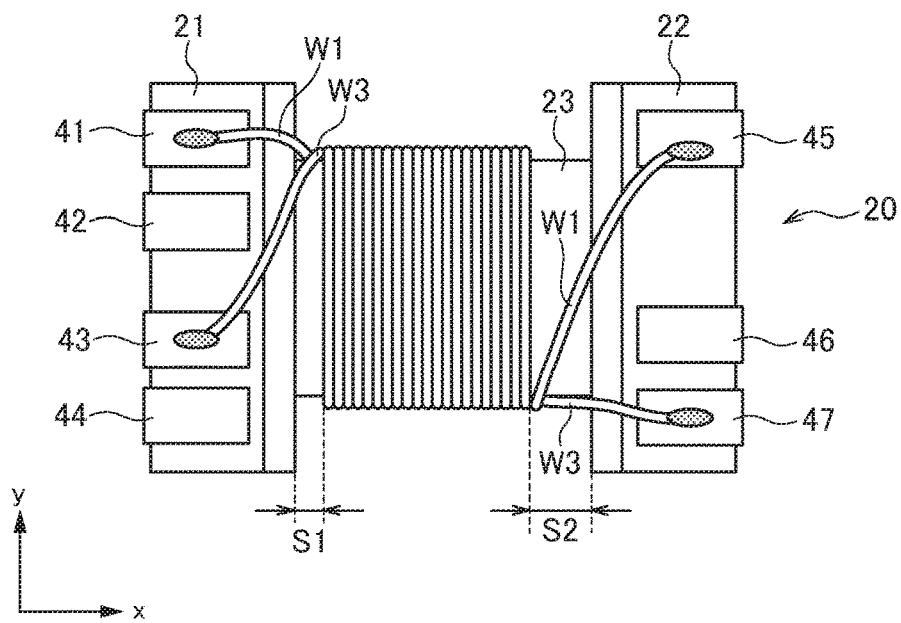

After that, the first and third wires W1 and W3 are wound around the winding core part 23 by a predetermined number of turns. Then, as illustrated in FIG. 4, the other end of the first wire W1 is connected to the fifth terminal electrode 45, and the other end of the third wire W3 is connected to the seventh terminal electrode 47. A connection method used here is the above-mentioned thermal press fitting. Thus, winding of the first and third wires W1 and W3 is completed, whereby a winding layer (lower winding layer) constituted by the first and third wires W1 and W3 is formed on the winding core part 23. At this time, the lower winding layer is preferably offset to the first flange part 21 side. In other words, the first and third wires W1 and W3 are preferably wound such that a space S1 formed between the inside surface 21i of the first flange part 21 and the lower winding layer is narrower than a space S2 formed between the inside surface 22i of the second flange part 22 and the lower winding layer. This is because when the space S1 formed on the first flange part 21 side that is the winding start side is made narrow, the space S2 formed on the second flange part 22 side which is the winding end side can be made wide, so that it is possible to sufficiently ensure a margin for winding work.

Figure 5:
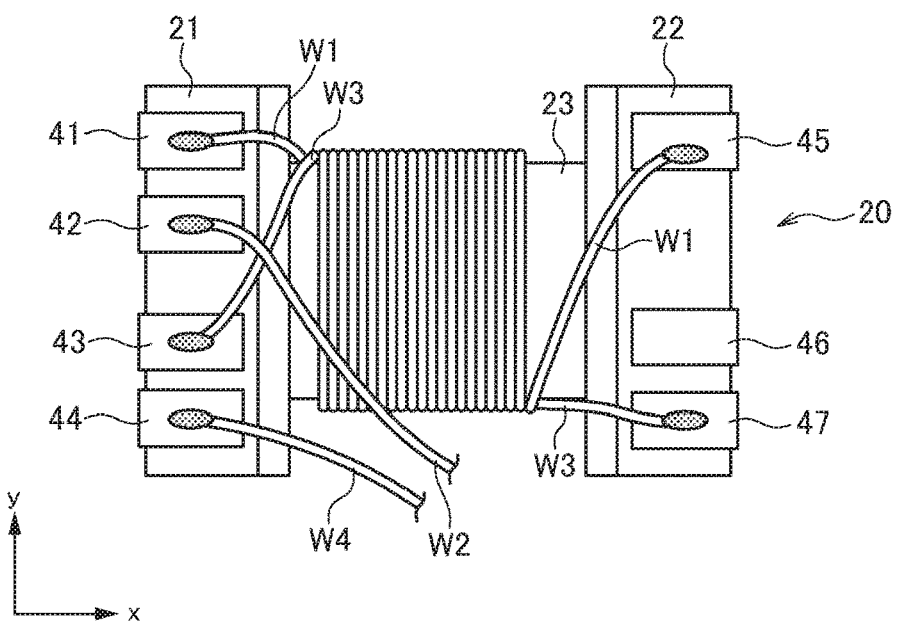

Then, as illustrated in FIG. 5, one end of the second wire W2 is connected to the second terminal electrode 42, and one end of the fourth wire W4 is connected to the fourth terminal electrode 44. A connection method used here is the above-mentioned thermal press fitting. In this state, the drum core 20 is rotated in the reverse direction to wind the second and fourth wires W2 and W4 around the winding core part 23 of the drum core 20. Upon starting the winding, the drum core 20 needs to be rotated in a state where the second and fourth wires W2 and W4 are pulled so as to prevent the second and fourth wires W2 and W4 from being loosened. Thus, somewhat strong tensile stress is applied to the joining parts of the respective second and fourth wires W2 and W4.

Figure 6:
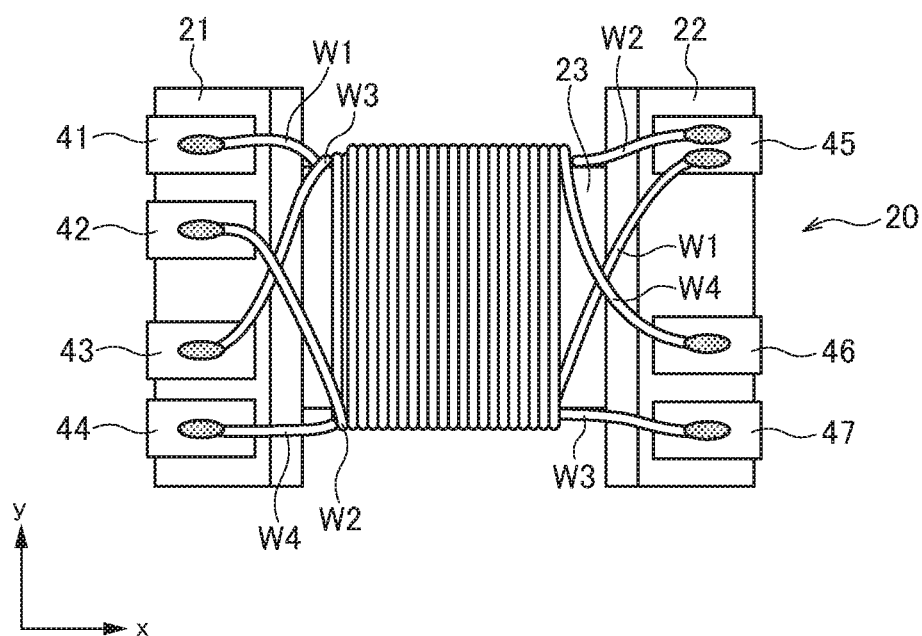

The second and fourth wires W2 and W4 are wound around the winding core part 23 by a predetermined number of turns. Then, as illustrated in FIG. 6, the other end of the second wire W2 is connected to the fifth terminal electrode 45, and the other end of the fourth wire W4 is connected to the sixth terminal electrode 46. A connection method used here is the above-mentioned thermal press fitting. Thus, winding of the second and fourth wires W2 and W4 is completed, whereby a winding layer (upper winding layer) constituted by the second and fourth wires W2 and W4 is formed on the lower winding layer constituted by the first and third wires W1 and W3. The upper winding layer is also preferably offset to the first flange part 21 side for the same reason as described above. That is, a winding block constituted by the upper and lower winding layers is preferably offset as a whole to the first flange part 21 side.

Then, the plate-like core 30 is bonded to the top surfaces 21t and 22t of the flange parts 21 and 22, whereby the coil component 10A according to the present embodiment is completed.

As described above, in the coil component 10A according to the present embodiment, the four terminal electrodes 41 to 44 are provided on the first flange part 21 that is positioned on the winding start side, so that it is not necessary to join a plurality of wires to one terminal electrode on the first flange part 21 side. When a plurality of wires are joined to one terminal electrode, a CuNi alloy required for ensuring joining strength may become insufficient. However, in the coil component 10A according to the present embodiment, lowering of the joining strength due to joining of a plurality of wires to one terminal electrode does not occur, the tensile stress at the start of winding of the wires W1 to W4 can be accepted. The joining strength required for the joining part of each of the first to fourth wires W1 to W4 becomes greater as the diameter of a core material constituting each of the wires W1 to W4 is made larger, so that the coil component 10A according to the present embodiment is more effective when the diameter of the core material of the wires W1 to W4 is large.

On the other hand, the three terminal electrodes 45 to 47 are provided on the second flange part 22 that is the winding end side, and the two wires W1 and W2 are connected in common to the fifth terminal electrode 45, so that the distance between the fifth and sixth terminal electrodes 45 and 46 in the y-direction can be ensured sufficiently. This allows a withstand voltage between the primary and secondary sides to be enhanced.

Figure 7A:
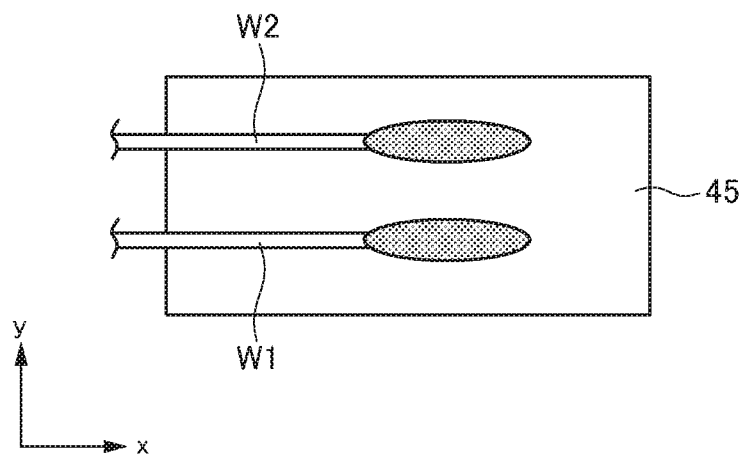
FIG. 7A is a diagram indicating a state where two wires are connected to proper positions on the terminal electrode.
Figure 7B:
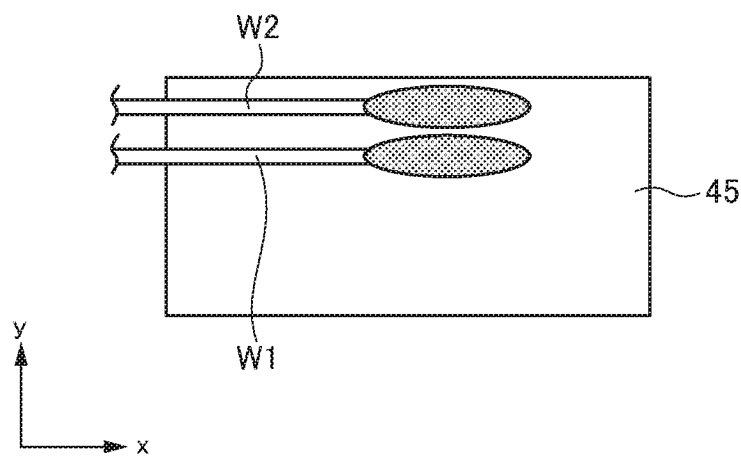
FIG. 7B is a diagram indicating a state where two wires are connected in the vicinity of the end portion of the terminal electrode.

However, in the present invention, to adopt the configuration where the four and three terminals are provided on the winding start side and the winding end side, respectively, is not required, but a reverse configuration where three and four terminals are provided on the winding start side and the winding end side, respectively, may be adopted. Such a configuration is effective when the film thickness of an insulating coating of each of the wires W1 to W4 is large. This is because when the film thickness of an insulating coating of each of the wires W1 to W4 is large, a residue of the insulating coating is easily accumulated on a wire guide for positioning of the wire upon completion of the winding. That is, when the wire guide normally functions, the other ends of the respective first and second wires W1 and W2 are connected to proper positions on the fifth terminal electrode 45, as illustrated in FIG. 7A; however, when the residue of the insulating coating is accumulated on the wire guide, a displacement occurs at the wire connection position, with the result that both the two wires are connected in the vicinity of the end portion of the fifth terminal electrode 45 as illustrated in FIG. 7B, which may degrade the reliability of the product. Such a phenomenon can be prevented by adopting the configuration where the four terminals are provided on the winding end side, so that the above problem caused due to the residue of the insulating coating can be solved.

The following describes a substrate on which the coil component 10A according to the present embodiment is mounted.

Figure 8:
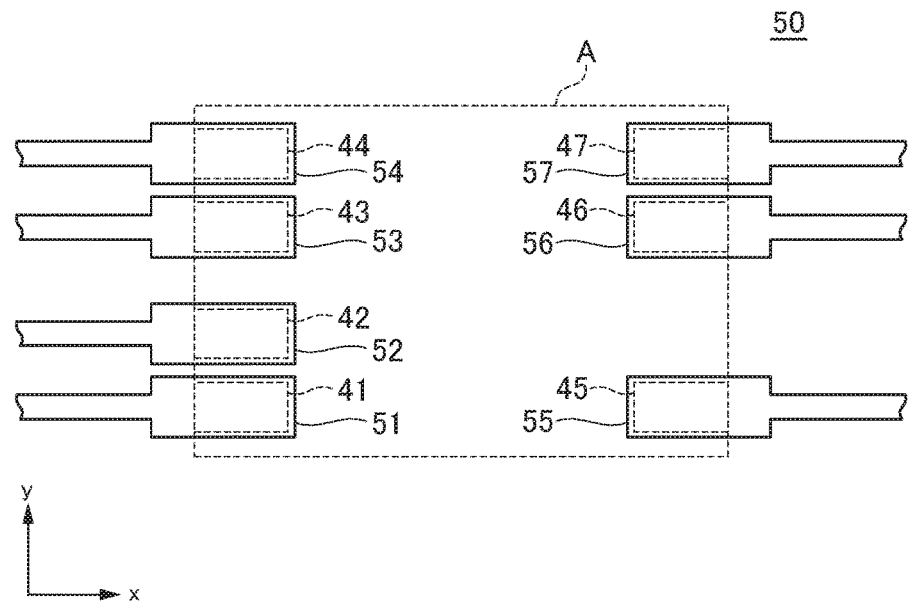
FIG. 8 is a plan view illustrating the configuration of a substrate on which the coil component according to the first embodiment of the present invention is mounted.
Figure 9:
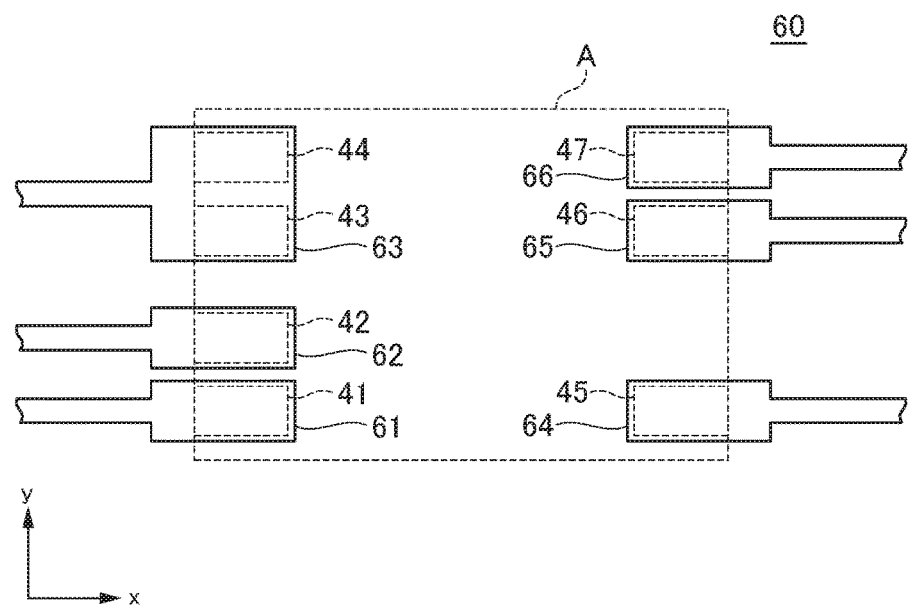
FIG. 9 is a plan view illustrating the configuration of another substrate on which the coil component according to the first embodiment of the present invention is mounted.
Figure 10:
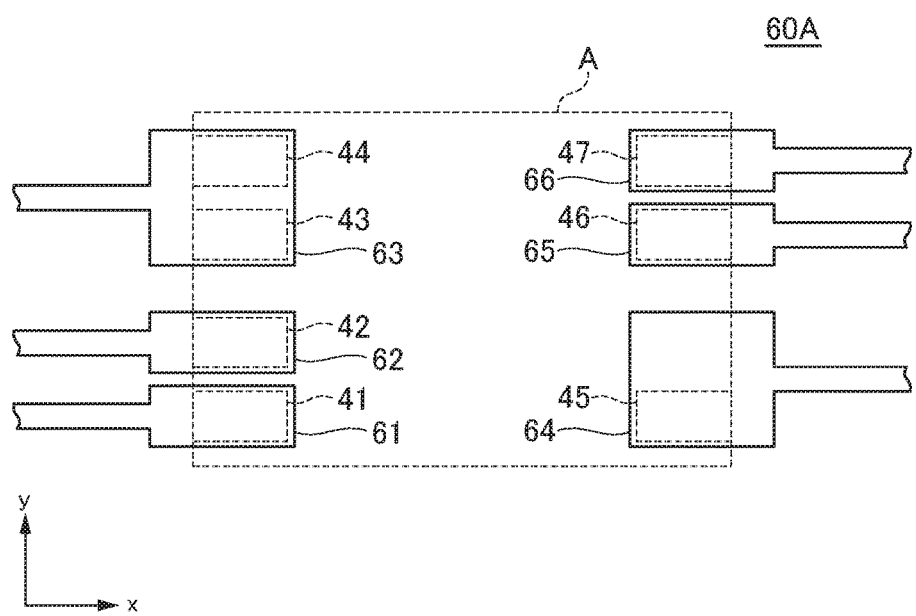
FIG. 10 is a plan view illustrating the configuration of still another substrate on which the coil component according to the first embodiment of the present invention is mounted.

FIG. 8 is a plan view illustrating the configuration of a substrate 50 on which the coil component 10A is mounted, which illustrates a conductor pattern in the vicinity of a mounting area A of the coil component 10A. FIG. 8 also illustrates the positions of the terminal electrodes 41 to 47 in a state where the coil component 10A is mounted on the substrate 50. The same is illustrated in FIGS. 9 and 10 to be described later. The substrate 50 illustrated in FIG. 8 has seven land patterns 51 to 57 formed in the mounting area A. The land patterns 51 to 57 are conductor patterns to be connected to the respective terminal electrodes 41 to 47. When the seven land patterns 51 to 57 are thus provided in the mounting area A of the substrate 50, the coil component 10A having the seven terminal electrodes 41 to 47 can be mounted properly.

FIG. 9 is a plan view illustrating the configuration of a substrate 60 on which the coil component 10A is mounted, which illustrates a conductor pattern in the vicinity of the mounting area A of the coil component 10A. The substrate 60 illustrated in FIG. 9 has six land patterns 61 to 66 formed in the mounting area A. The land pattern 61 is connected to the first terminal electrode 41, the land pattern 62 is connected to the second terminal electrode 42, the land pattern 63 is connected to the third and fourth terminal electrodes 43 and 44, the land pattern 64 is connected to the fifth terminal electrode 45, the land pattern 65 is connected to the sixth terminal electrode 46, and the land pattern 66 is connected to the seventh terminal electrode 47. When the one land pattern 63 is allocated to the third and fourth terminal electrodes 43 and 44 constituting the secondary-side center tap, the third and fourth terminal electrodes 43 and 44 can be short-circuited on the substrate 60. Further, the land pattern 63 is connected to the two terminal electrodes 43 and 44, so that it has a planar size larger than those of the other land patterns 61, 62, and 64 to 66.

FIG. 10 is a plan view illustrating the configuration of a substrate 60A on which the coil component 10A is mounted, which illustrates a conductor pattern in the vicinity of the mounting area A of the coil component 10A. The substrate 60A illustrated in FIG. 10A differs from the substrate 60 of FIG. 9 in that the planar size of the land pattern 64 is enlarged. Other configurations are the same as those of the substrate 60 of FIG. 9. When the land pattern 64 is thus enlarged, the coil component 10A can be mounted in a 180° inverted state, that is, the coil component 10A can be mounted regardless of its directionality. In this case, the planar sizes of the land patterns 63 and 64 are preferably made equal.

Second Embodiment

Figure 11:
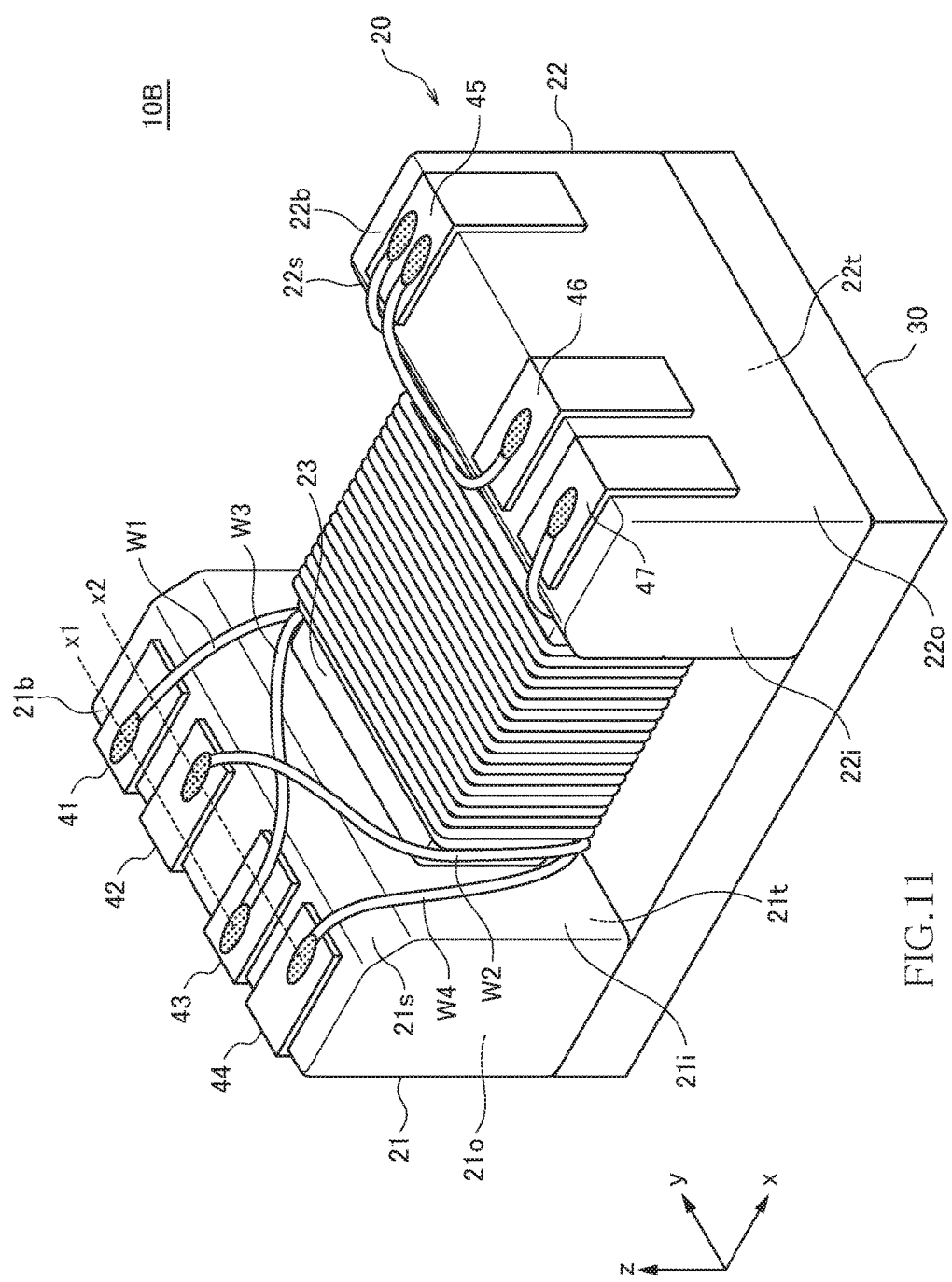
FIG. 11 is a schematic perspective view illustrating the outer appearance of a coil component according to a second embodiment of the present invention.
Figure 12:
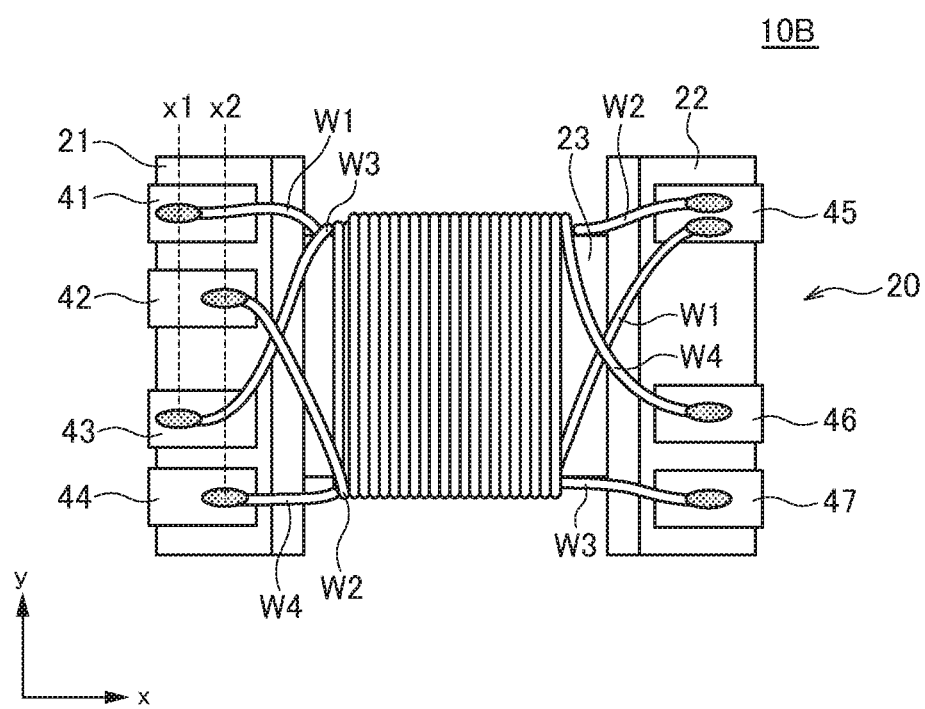
FIG. 12 is a plan view of the coil component according to the second embodiment of the present invention.

FIG. 11 is a schematic perspective view illustrating the outer appearance of a coil component 10B according to the second embodiment of the present invention. FIG. 12 is a plan view of the coil component 10B according to the second embodiment.

As illustrated in FIGS. 11 and 12, the coil component 10B according to the present embodiment differs from the coil component 10A according to the first embodiment in that connection positions x1 of one ends of the respective first and third wires W1 and W3 in the x-direction and connection positions x2 of one ends of the respective second and fourth wires W2 and W4 in the x-direction differ from each other. Specifically, the connection position x1 is closer to the outside surface 21o of the first flange part 21 than the connection position x2 is. Other configurations are the same as those of the coil component 10A according to the first embodiment, so the same reference numerals are given to the same elements, and overlapping description will be omitted.

Figure 13:
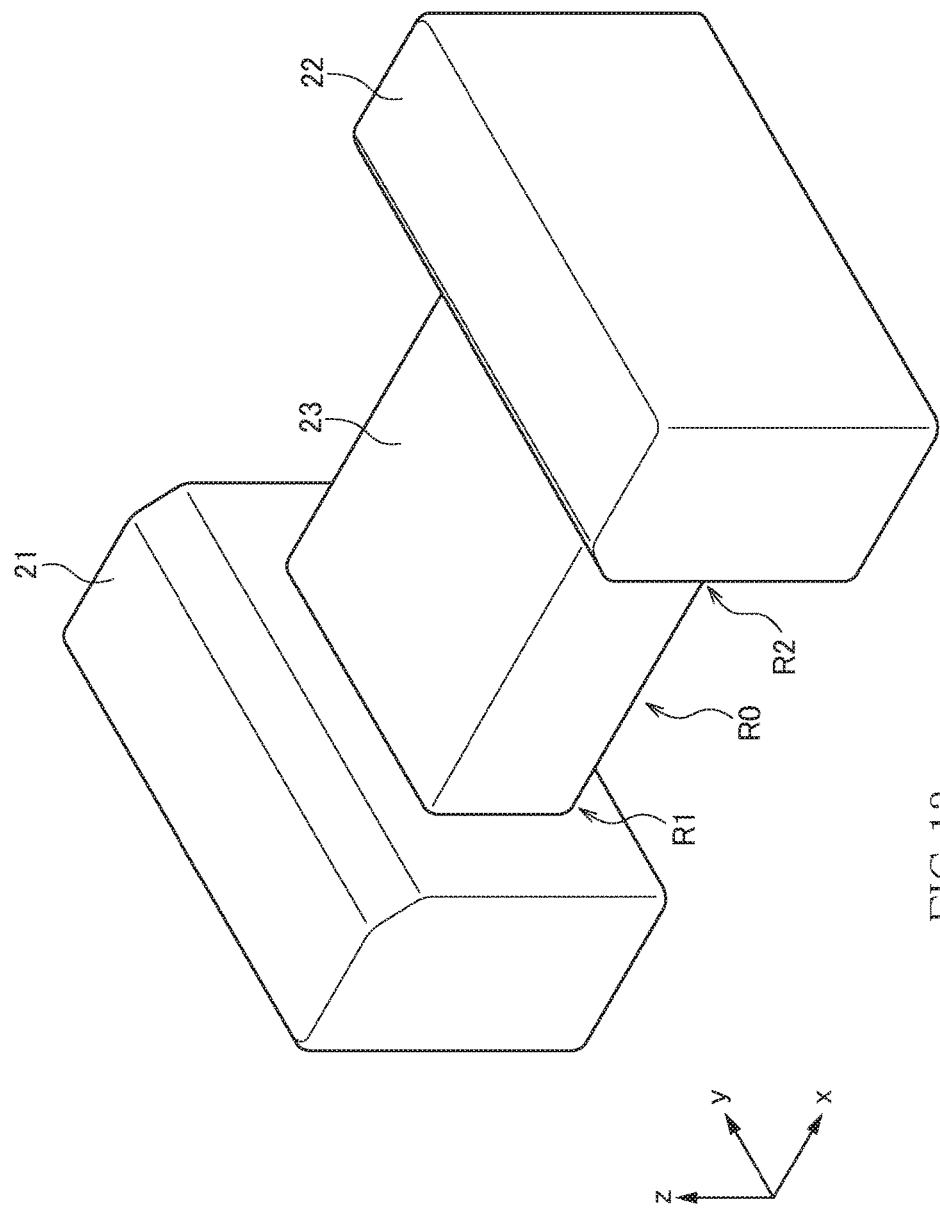
FIG. 13 is a schematic perspective view for explaining the configuration of the drum core.

FIG. 13 is a schematic perspective view for explaining the configuration of the drum core 20.

As illustrated in FIG. 13, all the corner portions of the drum core 20 are chamfered and each have a predetermined chamfered radius. Such chamfering is performed by barrel polishing. However, the drum core 20 has a complicated shape and has therefore a portion (corner) easily chamfered and a portion (corner) hardly chamfered, and at the portion hardly chamfered, the chamfered radius may be reduced. Specifically, in the winding core part 23, a first end region R1 near the inside surface 21i of the first flange part 21 and a second end region R2 near the inside surface 22i of the second flange part 22 are hardly chamfered due to the existence of the flange parts 21 and 22.

Thus, although the winding core part 23 has a rectangular shape as a whole whose corners are chamfered in the yz cross section (cross section perpendicular to the axial direction), the chamfered radius at the first and second end regions R1 and R2 may be smaller than the chamfered radius at a center region R0 positioned between the first and second end regions R1 and R2. In such a case, stress applied to the wires W1 and W3 of the lower winding layer directly contacting the winding core part 23 tends to be large at the first and second end regions R1 and R2. In particular, since the first end region R1 is positioned on the winding start side, the space S1 (see FIG. 4) formed between the inside surface 21i of the first flange part 21 and the lower winding layer is set narrow, and the wires W1 and W3 are pulled comparatively strongly at the start of winding. Thus, large stress is applied to the first and third wires W1 and W3 contacting the corner portion of the first end region R1.

Figure 14:
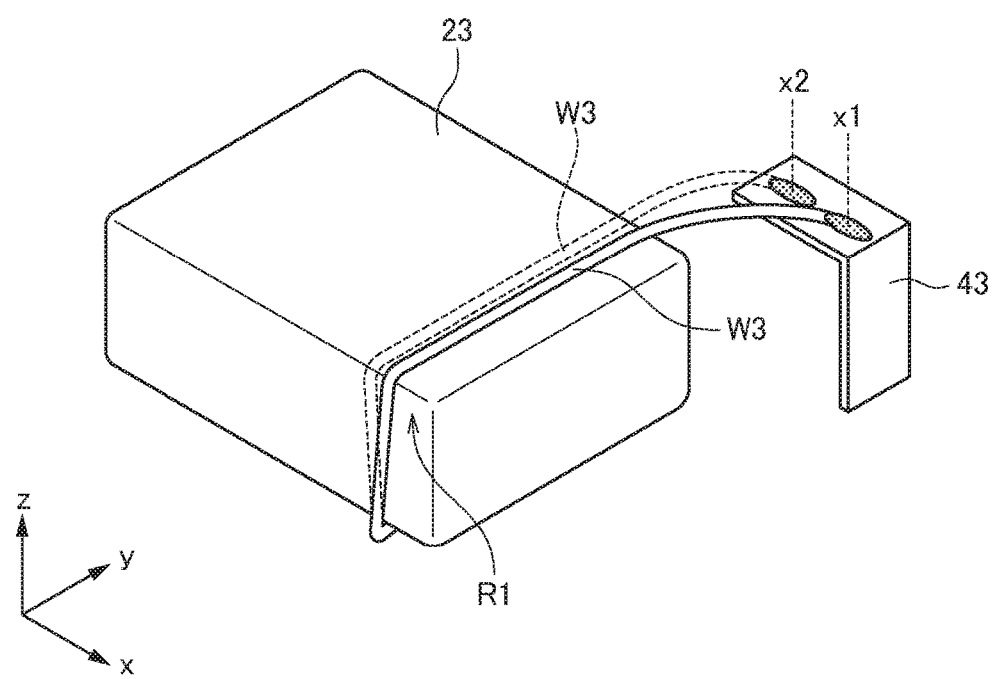
FIG. 14 is a schematic diagram for explaining an effect obtained by shifting the connection positions.

Considering the above point, in the coil component 10B according to the present embodiment, the connection positions x1 of one ends of the respective first and third wires W1 and W3 are shifted to the outside surface 21o side for stress relaxation. A mechanism for stress relaxation due to the shifting of the connection position is as follows. That is, as illustrated in FIG. 14 which is a schematic perspective view, a comparison is made between a case where the third wire W3 is connected at the connection position x1 (position near the outside surface 21o) and a case where the third wire W3 is connected at the connection position x2 (position near the inside surface 21i). In this case, since the connection position x1 is shifted to the outside surface 21o side, the bending angle of the third wire W3 at the corner portion of the first end region R1 becomes gentler when the third wire W3 is connected at the connection position x1 than when connected at the connection position x2. Thus, stress to be applied to the third wire W3 at the corner portion of the first end region R1 is relieved. When the connection positions of one ends of the first and third wires W1 and W3 are shifted to the outside surface 21o side based on such a mechanism, stress to be applied to the first and third wires W1 and W3 caused due to contact with the corner portion of the first end region R1 is relieved. As a result, disconnection of the wires W1 and W3 or damage to the insulation coating thereof is prevented, thus making it possible to further enhance the reliability of the product.

On the other hand, the second and fourth wires W2 and W4 constitute the upper winding layer do not basically directly contact the winding core part 23, so that such stress as that applied to the first and third wires W1 and W3 does not occur. Thus, the connection positions of the second and fourth wires W2 and W4 are not shifted to the outside surface 21o side, but the second and fourth wires W2 and W4 are connected at the connection position x2 near the inside surface 21i.

However, when the wire connection position is shifted to the outside surface 21o side, a CuNi alloy generated by the thermal press fitting is formed on the vertical part of the terminal electrode, i.e., a part of the terminal electrode that extends in the z-direction while covering the outside surface 21o or a part near it, with the result that solder wettability at this part may be deteriorated. When solder wettability at this part is deteriorated, a solder filet is hardly formed when the coil component 10B is mounted on the substrate, which may deteriorate connection reliability in some cases. Considering this point, in the coil component 10B according to the present embodiment, while one ends of the first and third wires W1 and W3 are shifted to the outside surface 21o side, one ends of the second and fourth wires W2 and W4 are not shifted but connected at positions separated from the vertical part of the terminal electrode, thereby minimizing a possibility that the connection reliability is deteriorated.

Third Embodiment

Figure 15:
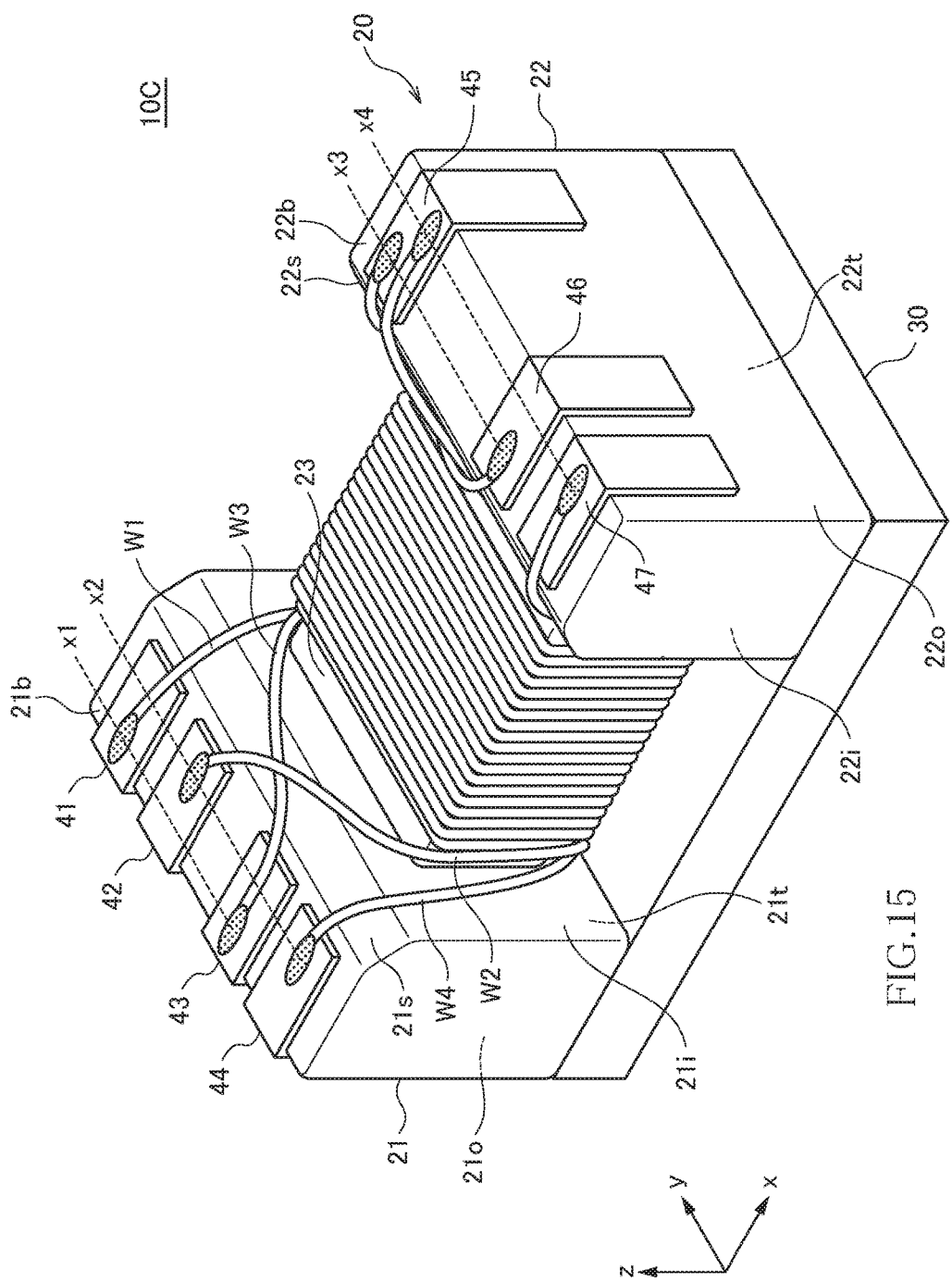
FIG. 15 is a schematic perspective view illustrating the outer appearance of a coil component according to a third embodiment of the present invention.
Figure 16:
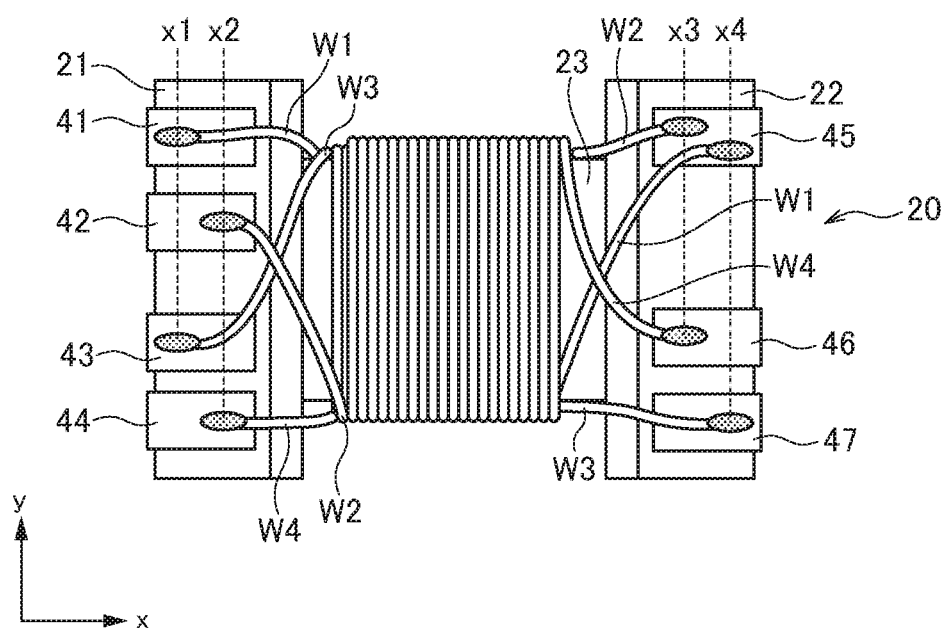
FIG. 16 is a plan view of the coil component according to the third embodiment of the present invention.

FIG. 15 is a schematic perspective view illustrating the outer appearance of a coil component 10C according to a third embodiment of the present invention. FIG. 16 is a plan view of the coil component 10C according to the third embodiment.

As illustrated in FIGS. 15 and 16, the coil component 10C according to the present embodiment differs from the coil component 10B according to the second embodiment in that connection positions x4 of the other ends of the respective first and third wires W1 and W3 in the x-direction and connection positions x3 of the other ends of the respective second and fourth wires W2 and W4 in the x-direction differ from each other. Specifically, the connection position x4 is closer to the outside surface 22o of the second flange part 22 than the connection position x3 is. Other configurations are the same as those of the coil component 10B according to the second embodiment, so the same reference numerals are given to the same elements, and overlapping description will be omitted.

Since the connection positions of the other ends of the respective first and third wires W1 and W3 are also shifted to the outside surface side, stress to be applied to the first and third wires W1 and W3 caused due to contact between the winding ends of the respective first and third wires W1 and W3 and the corner portion of the second end region R2 of the winding core part 23 is also relieved.

As described above, the space S2 (see FIG. 4) formed between the inside surface 22i of the second flange part 22 and the lower winding layer tends to become wider than the space S1, so that there may be a case where the winding ends of the first and third wires W1 and W3 do not contact the second end region R2. However, the space S2 undergoes a larger dimensional change due to manufacturing variations than the space S1 does, so that the winding ends of the first and third wires W1 and W3 may contact the corner portion of the second end region R2 in some manufacturing condition, causing stress to be applied to the contact portion. Considering this point, in the coil component 10C according to the present embodiment, the connection positions x4 of the other ends of the first and third wires W1 and W3 are shifted to the outside surface side. This relieves the above stress, thus making it possible to further enhance the reliability of the product.

It is apparent that the present invention is not limited to the above embodiments, but may be modified and changed without departing from the scope and spirit of the invention.

What is claimed is:

1. A coil component comprising:
    a drum core including a winding core part, a first flange part provided at one end of the winding core part in an axial direction of the winding core part, and a second flange part provided at other end of the winding core part in the axial direction of the winding core part;
    first, second, third, and fourth terminal electrodes provided on the first flange part;
    fifth, sixth, and seventh terminal electrodes provided on the second flange part; and
    first, second, third, and fourth wires wound around the winding core part,
    wherein one ends of the first to fourth wires are each connected to any one of the first to fourth terminal electrodes,
    wherein other ends of the first to fourth wires are each connected to any one of the fifth to seventh terminal electrodes,
    wherein the first to fourth terminal electrodes are arranged in this order in a direction substantially perpendicular to the axial direction,
    wherein the fifth to seventh terminal electrodes are arranged in this order in the direction substantially perpendicular to the axial direction,
    wherein the one end of the first wire is connected to one of the first and second terminal electrodes,
    wherein the one end of the second wire is connected to other one of the first and second terminal electrodes, and
    wherein the other ends of the first and second wires are connected in common to the fifth terminal electrode.

2. The coil component as claimed in claim 1,
    wherein the one end of the third wire is connected to one of the third and fourth terminal electrodes,
    wherein the one end of the fourth wire is connected to other one of the third and fourth terminal electrodes,
    wherein the other end of the third wire is connected to one of the sixth and seventh terminal electrodes,
    wherein the other end of the fourth wire is connected to other one of the sixth and seventh terminal electrodes, and
    wherein the first and third wires and second and fourth wires are wound in opposite directions.

3. The coil component as claimed in claim 2, wherein the first to fourth wires wound around the winding core part form a winding block including a lower layer constituted of the first and third wires and an upper layer constituted of the second and fourth wires wound over the lower layer.

4. The coil component as claimed in claim 3,
    wherein each of the first and second flange parts has an inside surface connected to the winding core part, and
    wherein a space formed between the inside surface of the first flange part and the winding block is narrower than a space formed between the inside surface of the second flange part and the winding block.

5. The coil component as claimed in claim 4,
    wherein each of the first and second flange parts has an outside surface positioned on a side opposite to the inside surface, and
    wherein a distance between connection positions of the one ends of the first and third wires and the outside surface of the first flange part is shorter than a distance between connection positions of the one ends of the second and fourth wires and the outside surface of the first flange part.

6. The coil component as claimed in claim 5, wherein a distance between connection positions of the other one ends of the first and third wires and the outside surface of the second flange part is shorter than a distance between connection positions of the other one ends of the second and fourth wires and the outside surface of the second flange part.

7. A circuit board comprising:
    a coil component; and
    a substrate on which the coil component is mounted,
    wherein the component comprising:
        a drum core including a winding core part, a first flange part provided at one end of the winding core part in an axial direction of the winding core part, and a second flange part provided at other end of the winding core part in the axial direction of the winding core part;
        first, second, third, and fourth terminal electrodes provided on the first flange part;
        fifth, sixth, and seventh terminal electrodes provided on the second flange part; and
        first, second, third, and fourth wires wound around the winding core part,
    wherein one ends of the first to fourth wires are each connected to any one of the first to fourth terminal electrodes, wherein other ends of the first to fourth wires are each connected to any one of the fifth to seventh terminal electrodes, wherein the first to fourth terminal electrodes are arranged in this order in a direction substantially perpendicular to the axial direction, wherein the fifth to seventh terminal electrodes are arranged in this order in the direction substantially perpendicular to the axial direction, wherein the one end of the first wire is connected to one of the first and second terminal electrodes, wherein the one end of the second wire is connected to other one of the first and second terminal electrodes, and wherein the other ends of the first and second wires are connected in common to the fifth terminal electrode.

8. The circuit board as claimed in claim 7, wherein the substrate has first to seventh land patterns connected respectively to the first to seventh terminal electrodes.

9. The circuit board as claimed in claim 7, wherein the substrate has first to sixth land patterns, and wherein the first land pattern is connected to the first terminal electrode, the second land pattern is connected to the second terminal electrode, the third land pattern is connected to the third and fourth terminal electrodes, the fourth land pattern is connected to the fifth terminal electrode, the fifth land pattern is connected to the sixth terminal electrode, and the sixth land pattern is connected to the seventh terminal electrode.

10. The circuit board as claimed in claim 9, wherein a planar size of the third land pattern is larger than a planar size of each of the first, second, fifth, and sixth land patterns.

11. The circuit board as claimed in claim 10, wherein the third and fourth land patterns have substantially a same planar size.

12. A method for manufacturing a coil component, the method comprising:

preparing a drum core including a winding core part, a first flange part provided at one end of the winding core part in an axial direction of the winding core part, and a second flange part provided at other end of the winding core part in the axial direction of the winding core part;

forming first, second, third, and fourth terminal electrodes arranged in this order in a direction substantially perpendicular to the axial direction on the first flange part;

forming fifth, sixth, and seventh terminal electrodes arranged in this order in the direction substantially perpendicular to the axial direction on the second flange part;

winding first and third wires around the winding core part of the drum core in a state where one end of the first wire is connected to one of the first and second terminal electrodes and where one end of the third wire is connected to one of the third and fourth terminal electrodes and thereafter connecting other ends of the first and third wires respectively to the fifth terminal electrode and one of the sixth and seventh terminal electrodes; and winding second and fourth wires around the winding core part of the drum core in a state where one end of the second wire is connected to other one of the first and second terminal electrodes and where one end of the fourth wire is connected to other one of the third and fourth terminal electrodes and thereafter connecting other ends of the second and fourth wires respectively to the fifth terminal electrode and other one of the sixth and seventh terminal electrodes.

13. The method for manufacturing a coil component as claimed in claim 12, wherein each of the first and second flange parts has an inside surface connected to the winding core part and an outside surface positioned on a side opposite to the inside surface, and wherein a distance between connection positions of the one ends of the first and third wires and the outside surface of the first flange part is shorter than a distance between connection positions of the one ends of the second and fourth wires and the outside surface of the first flange part.

14. The method for manufacturing a coil component as claimed in claim 13, wherein a distance between connection positions of the other one ends of the first and third wires and the outside surface of the second flange part is shorter than a distance between connection positions of the other one ends of the second and fourth wires and the outside surface of the second flange part.

* * * * *

UNITED STATES PATENT AND TRADEMARK OFFICE
CERTIFICATE OF CORRECTION

PATENT NO. : 10,347,416 B2
APPLICATION NO. : 16/007152
DATED : July 9, 2019
INVENTOR(S) : Tasuku Mikogami and Nobuo Takagi Page 1 of 1

It is certified that error appears in the above-identified patent and that said Letters Patent is hereby corrected as shown below:

On the Title Page

Include:
Foreign Application Priority Data:     Jun 15, 2017    [JP] 2017-117630

Signed and Sealed this
Thirtieth Day of June, 2020

Andrei Iancu
*Director of the United States Patent and Trademark Office*